United States Patent

Mantell

[11] Patent Number: 5,220,726
[45] Date of Patent: Jun. 22, 1993

[54] METHOD FOR MANUFACTURING AN ELECTRICALLY CONNECTABLE MODULE

[75] Inventor: David A. Mantell, Rochester, N.Y.
[73] Assignee: Xerox Corporation, Stamford, Conn.
[21] Appl. No.: 721,080
[22] Filed: Jun. 26, 1991
[51] Int. Cl.⁵ .................................... H01R 43/16
[52] U.S. Cl. .................................... 29/885; 29/840; 29/850; 156/901; 174/265; 361/403; 428/901
[58] Field of Search .............. 29/840, 850, 885; 156/901, 902; 361/403; 428/901; 174/265

[56] References Cited

U.S. PATENT DOCUMENTS

| | | |
|---|---|---|
| 3,818,279 | 6/1974 | Seeger, Jr. et al. . |
| 3,984,620 | 10/1976 | Robillard et al. . |
| 4,255,853 | 3/1981 | Campillo et al. ............. 29/850 X |
| 4,604,678 | 8/1986 | Hagner . |
| 4,644,445 | 2/1987 | Sakuma ..................... 361/403 X |
| 4,841,099 | 6/1989 | Epstein et al. . |
| 4,956,749 | 9/1990 | Chang ........................ 29/840 X |

FOREIGN PATENT DOCUMENTS

| | | |
|---|---|---|
| 18846 | 11/1980 | European Pat. Off. . |
| 230128 | 9/1987 | European Pat. Off. . |
| 90/13990 | 11/1990 | PCT Int'l Appl. . |

Primary Examiner—Carl J. Arbes
Attorney, Agent, or Firm—Oliff & Berridge

[57] ABSTRACT

An electrically connectable module is manufactured from a substrate of an electrically insulating polymer matrix doped with an electrically insulating fibrous filler capable of heat conversion to an electrically conductive fibrous filler to form a fiber-doped substrate. One end of an electrical connector is embedded in the fiber-doped substrate to locate the one end adjacent the surface of the substrate while exposing an opposite end of the electrical connector. The surface of the fiber-doped substrate is locally heated preferably with a laser to form a conductive trace by the in-situ heat conversion of the electrically insulating fibrous filler, the localized heating including the one end of the electrical connector to electrically connect the electrical connector to the conductive trace. In another embodiment, a conductive material is electrodeposited on the conductive trace by applying a voltage to the opposite end of the electrical connector. The substrate is molded into a desired shape to form the module, and a plurality of electrical connectors can be embedded into the substrate in any one of several different standardized arrangements.

27 Claims, 2 Drawing Sheets

METHOD FOR MANUFACTURING AN ELECTRICALLY CONNECTABLE MODULE

BACKGROUND OF THE INVENTION

1. Field of the Invention

The invention relates to an electrically connectable module and a method for manufacturing same in which an electrical connector is embedded in a substrate of an electrically insulating polymer matrix doped with an electrically insulating fibrous filler capable of heat conversion to an electrically conductive fibrous filler. Localized heating of the substrate adjacent the electrical connector produces a conductive trace formed in the substrate and forms an electrical connection between the pre-embedded electrical connector and the conductive trace. More particularly, the invention relates to an electrically connectable module and a method of making it, in which an electrical connection is formed between one end of an electrical connector (previously embedded in a polymer matrix) and a laser-produced conductive trace formed in the polymeric substrate, for the dual purposes of using the electrical connector for electrodepositing a conductive material onto the conductive trace and for subsequent electrical connection to an external electrical component.

2. Discussion of Related Art

In electrical machines such as image reproducing devices, it is necessary to distribute power and/or logic signals to various sites within the machine. Traditionally, this has taken the form of using conventional wires and wiring harnesses in the machine to distribute the power and logic signals to the various functional elements in the machine.

As an alternative to wires, it is known to use a $CO_2$ laser to burn conductive traces in a polymeric material that has been doped with carbon fibers so that the untreated material (not subjected to the laser) is not conductive. When locally heated by the laser, the polymeric material volatilizes to leave a conductive network of polymer residue and conductive dopant. U.S. Pat. No. 4,841,099 teaches how an electrically insulating polymer matrix is filled with an electrically insulating fibrous filler capable of heat conversion to an electrically conducting fibrous filler, to form a continuous electrically conductive path by the in-situ heat conversion of the electrically insulating fibrous filler using a laser. The entire disclosure of U.S. Pat. No. 4,841,099 is herein incorporated by reference.

In order to make the conductivity of the traces more sufficient for many applications, it has been proposed that metal be electrodeposited onto the traces. One advantage of this electrodepositing approach is to place metal conductors onto the polymeric material in the trough or channel created by the laser with the metal adhering to the polymeric material. However, the prior art has not developed or suggested methods for reliably electroplating the trace, or for connecting the traces to electrical connectors in the polymeric material for distributing power or signals between the trace and an external component.

U.S. Pat. No. 4,604,678 to Hagner discloses a circuit board plated with high density electrical traces connected to respective terminals of a number of electrical current components mounted on a substrate. Grooves on the substrate can be machined by a laser. The components are assembled before the grooves are plated to minimize production costs and assure electrical connection between the plated laser-formed grooves and the terminals of respective components. The conductive traces overlie and are in electrical contact with chip pads.

U.S. Pat. No. 3,984,620 to Robillard et al. discloses an integrated circuit chip test and assembly package having a semiconductor interconnection substrate with apertures for integrated circuits. The assembly package includes an interconnection with external leads which are located between insulating layers of the substrate.

U.S. Pat. No. 3,818,279 to Seeger, Jr. et al. discloses an electrical interconnection and contacting system comprising a flexible plastic insulator, most preferably an elastomeric substrate having at least one layer of electrically conductive elastomeric material embedded therein. The system is useful in coupling integrated circuits to other circuitry.

SUMMARY OF THE INVENTION

It is thus a feature of the invention to provide an electrically connectable module and a method for manufacturing same, in which an electrical connector pre-embedded into the module is electrically connected to a conductive trace upon formation of the conductive trace on a surface of the module.

Another feature of the invention is to reliably electroplate a conductive trace formed in a polymeric material by localized laser heating.

It is another feature of the invention to reliably connect the conductive trace to an electrical connector embedded in the polymeric material.

According to one aspect of the present invention, a method of manufacturing an electrically connectable module from a substrate of an electrically insulating polymer matrix comprises the steps of: doping the substrate with an electrically insulating fibrous filler capable of heat conversion to an electrically conductive fibrous filler, to form a fiber-doped substrate; and embedding one end of an electrical connector in the fiber-doped substrate to locate the one end adjacent a surface of the substrate while exposing an opposite end of the electrical connector. The surface of the fiber-doped substrate is then locally heated preferably with a laser to form a conductive trace by the in-situ heat conversion of the electrically insulating fibrous filler, including the localized heating at the one end of the electrical connector to electrically connect the electrical connector to the conductive trace.

According to another aspect of the present invention, the opposite end of the electrical connector is then used to apply a voltage to the conductive trace for electrodepositing a conductive material on the conductive trace.

In accordance with another aspect of the invention, an electrically connectable module comprises a substrate formed from an electrically insulating polymer matrix doped with an electrically insulating fibrous filler capable of heat conversion to an electrically conductive fibrous filler; an electrical connector embedded into the substrate and having one end adjacent a surface of the substrate and an opposite end exposed from the substrate; a continuous electrically conductive trace formed on the surface of the substrate by in-situ heat conversion of the electrically insulating fibrous filler; and a connection formed between the one end of electrical connector and the conductive trace by the in-situ heat conversion of the electrically insulating fibrous filler in the polymer matrix surrounding the one end of the electrical connector.

BRIEF DESCRIPTION OF THE DRAWINGS

These and other objects and features of the invention will be described in detail with reference to the following figures wherein.

DETAILED DESCRIPTION OF THE PREFERRED EMBODIMENTS

Figure 1A:
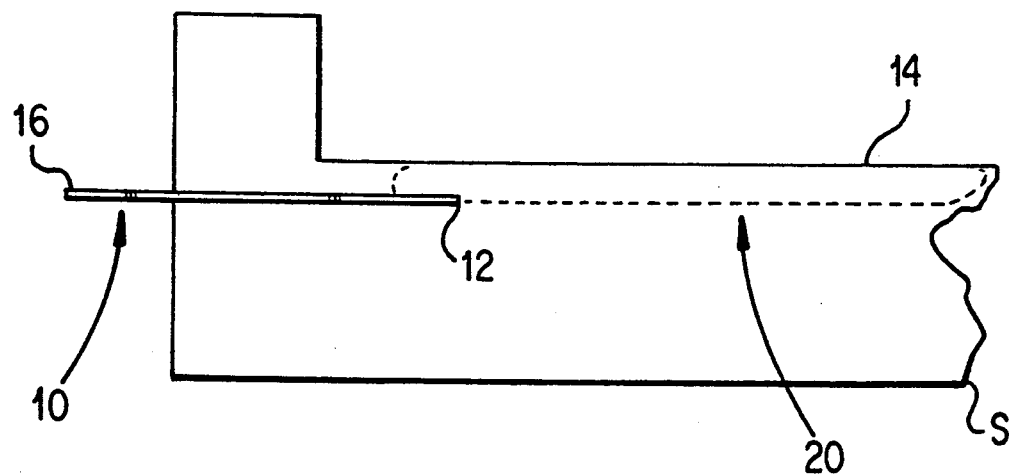
FIG. 1A is a side view of a molded component doped with carbon fibers and having embedded electrical connectors.

In accordance with preferred embodiments of the invention and as illustrated in FIGS. 1A, 1B, 2A, 2B and 2C, an electrical connector 10 is embedded in a substrate S which is preferably an electrically insulating polymer matrix material molded to a desired shape. The disclosure of U.S. Pat. No. 4,841,099 (which is herein incorporated by reference) describes the polymer materials. One end 12 of the connector 10 is buried at or just below the surface 14 of the polymer, while the opposite end 16 is exposed from the molded polymeric material. After the process described below, the opposite or exposed end 16 will be available for electrical connection to a component external to the molded polymeric material.

The substrate S has been doped with an electrically insulating fibrous filler capable of heat conversion to an electrically conductive fibrous filler. Typical fibrous fillers are petroleum pitch based carbon fibers which are heat convertible carbonaceous fibers, such as thermally stabilized, polyacrylonitrile fibers which upon heat conversion provide electrically conducting fibers (also known as preox fibers as disclosed in U.S. Pat. No. 4,841,099). Localized heating of the surface 14 of the fiber-doped substrate S with a laser forms conductive traces 20. The disclosure of U.S. Pat. No. 4,841,099 (which is incorporated by reference) describes the materials and processes for doping the fibers in the substrate and forming the conductive traces.

In accordance with the invention, the localized heating to form the conductive trace 20 includes localized heating at the buried end 12 of the connector to volatilize the thin layer of polymeric material around the electrical connector 10, thus guaranteeing that the conductive fiber trace 20 will make electrical contact with the one end 12 of the connector 10. The localized heating can begin or end at the buried end 12 of the connector 10 when forming the trace 20. Accordingly, the electrical connector 10 is preembedded in the fiber-doped polymeric material and the electrical connection between the electrical connector and the conductive trace is formed simultaneously with the formation of the conductive trace by starting or ending the localized laser heating at the buried end 12 of the electrical connector.

After electrical connection to the trace, the electrical connector 10 can be used as a reliable connection to the laser buried trace for electrodeposition (which is cheaper than electroless deposition) of a conductive material (preferably copper) onto the trace. In particular, a voltage can be applied to the exposed end 16 of the electrical connector 10 to apply the voltage to the conductive trace for electrodeposition. The process of electrodeposition of conductive materials onto the trace is well known to those skilled in the art as evidenced by U.S. Pat. No. 4,841,099.

Figure 1B:
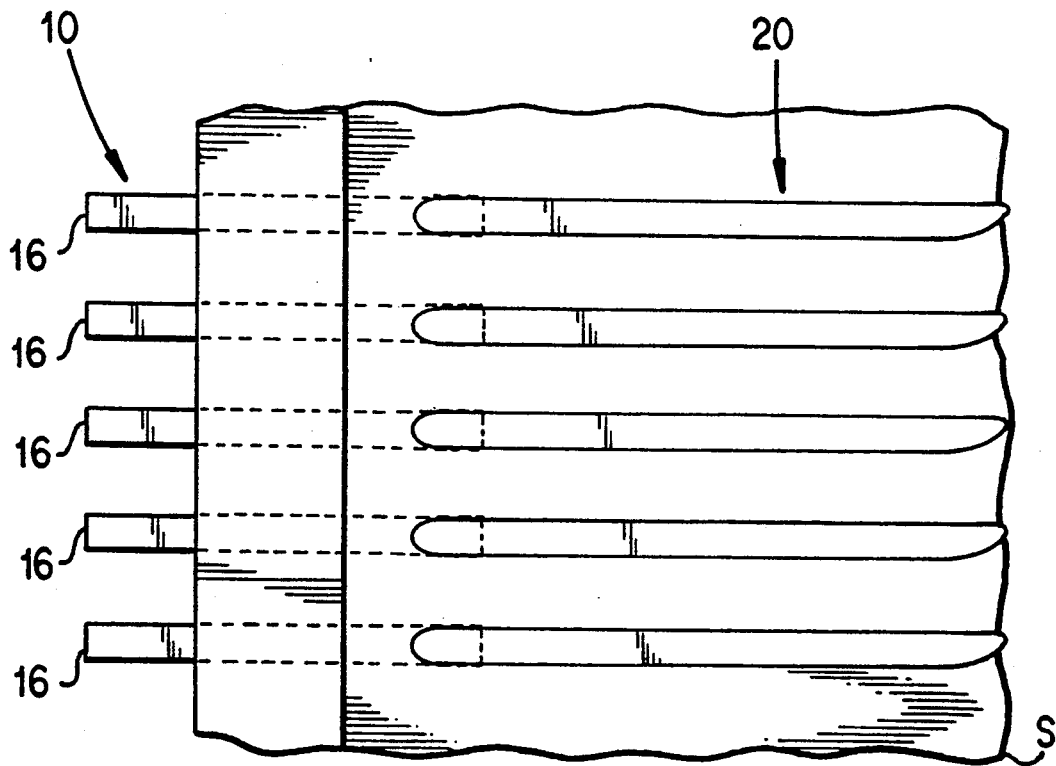
FIG. 1B is a top view of the component of FIG. 1A.
Figure 2A:
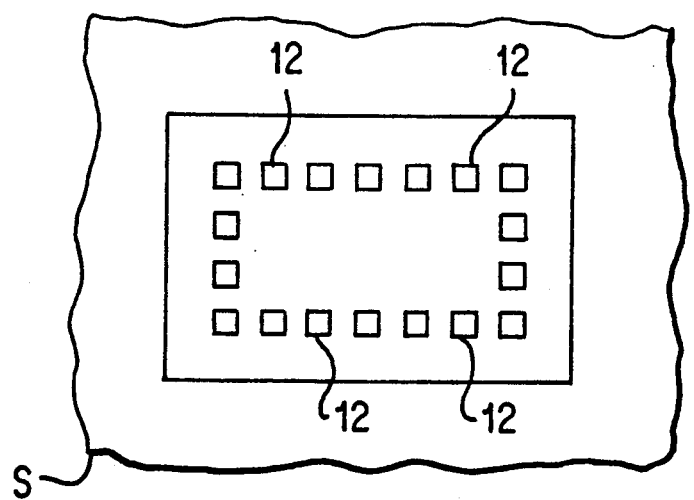
FIG. 2A is a plan view of one surface of a fiber-doped chip carrier having embedded electrical connectors.
Figure 2B:
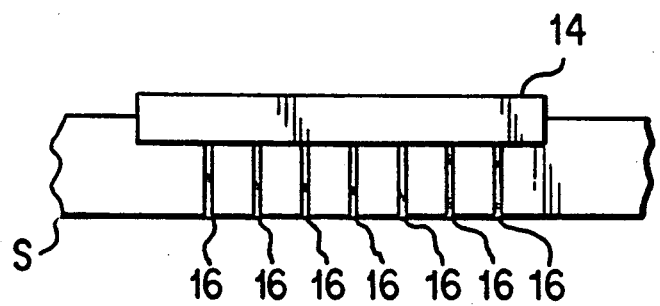
FIG. 2B is a side view of the chip carrier of FIG. 2A illustrating the embedded electrical connectors having one end extending to an upper surface of the carrier and an opposite end projecting from the lower surface of the carrier.
Figure 2C:
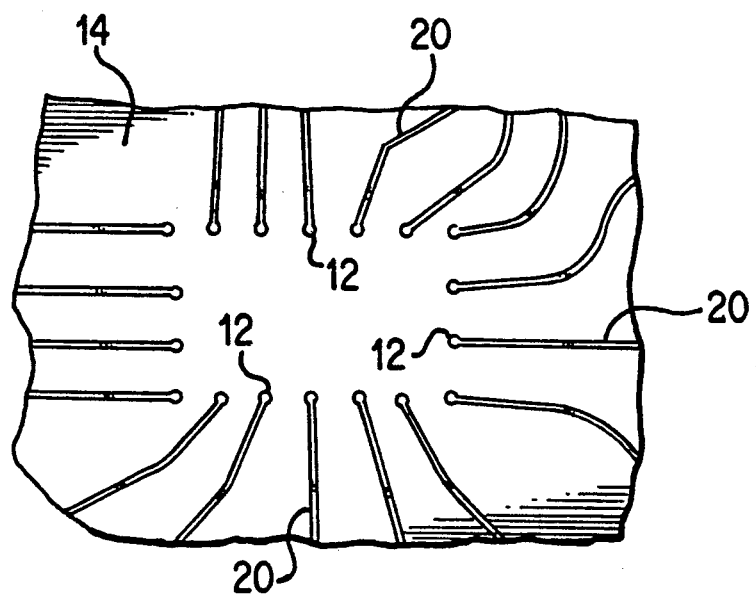
FIG. 2C is a plan view of the upper surface of the chip carrier of FIG. 2B illustrating the conductive traces connected to the ends of the electrical connectors.

FIGS. 1A and 1B and FIGS. 2A, 2B and 2C show two exemplary electrically connectable modules using the teachings of the present invention. The substrate S is prepared by molding into the desired shape, for example the prong arrangement of FIGS. 1A and 1B, or a standard chip carrier arrangement of FIGS. 2A, 2B and 2C. U.S. Pat. No. 841,099 discloses molding techniques. The substrate S is doped with carbon fibers and embedded with the electrical connectors 10. In FIGS. 1A and 1B, the electrical connectors 10 are prongs having their buried ends 12 adjacent the surface 14 of the module on which the traces will be formed. The opposite end 16 is exposed. In FIGS. 2A, 2B and 2C, the electrical connectors 10 are pins which have their buried ends 12 adjacent the surface 14 on which the conductive traces 20 will be formed with the pins extending to the opposite surface.

The conductive trace 20 is then formed on the surface S of the substrate with a laser, preferably by starting at the buried end 12 of the electrical connector 10 to connect the electrical connector 10 to the trace 20. Using the exposed end 16 of the electrical connector 10 to apply a voltage, the conductive material is electrodeposited on the laser trace 20. The electrical connector 10 is now used for connection to the trace 20 when the module is assembled into the machine. The electrical connections such as the prongs of FIGS. 1A and 1B or the pins of FIGS. 2A, 2B and 2C can be arranged in different standardized forms or predetermined arrangements for ease of connection to various electrical components. For example, in FIGS. 1A–1B, the prong arrangement can accept a similar female style connector. In FIGS. 2A, 2B, and 2C, the arrangement of pins accepts a carrier for an integrated circuit. It is also noted that the polymer provides mechanical support to the electrical connectors which allows rigid connections to be made when two polymer pieces are connected together. For example, two connector modules can be made in the manner described herein with male and female style connectors, respectively, which can then be mechanically connected together by standard methods to automatically electrically connect the modules together.

As an example, a standard four pin connector was embedded into a plastic part (the plastic part being a low cost molding material including polyphenylene oxides known as General Electric Noryl TM, and the plastic part being doped with preox fibers in an amount of about 30% by weight of the total filled polymer matrix) with the pins extending through the plastic to the other side. The module formed of the embedded connector and polymer matrix material can be manufactured and processed by any of the methods and examples of U.S. Pat. No. 4,841,099. A poor electrical connection between the pins and the conductive traces resulted if the buried ends of the pins were too deep into the plastic part or stuck too far out of the plastic part. Optimum results were achieved when the top of each pin was flush with the surface of the plastic part. Also, when burning the trace in the plastic part, a higher laser power (by about 30%) helped to make a better electrical connection between the pins and the laser burnt trace.

After the laser traces were made and rinsed with a solvent to remove residue, the resistance between a pin and the trace was about 200 ohms. This is equivalent to the resistance of a few inches of the laser trace in the plastic and was found not to limit electrodeposition of copper onto the traces. Traces were easily pated to a resistance of less than an ohm with a few hours of electroplating. Better morphologies were obtained in the electrodeposited copper if the deposition started only on the laser trace (keeping the connector pins out of the plating solution initially). This allowed a good conducting path to be made in the laser trace to reduce the potential drop along the trace which promoted preferential deposition on the pin rather than on the laser trace.

The invention has been described with reference to its preferred embodiments which are intended to be illustrative and not limiting. Various changes may be made by those skilled in the art without departing from the spirit and scope of the invention as defined in the appended claims.

What is claimed is:

1. A method of manufacturing an electrically connectable module from a substrate of an electrically insulating polymer matrix, the method comprising the steps of:
   doping the substance with an electrically insulating fibrous filler capable of heat conversion to an electrically conductive fibrous filler, to form a fiber-doped substrate;
   embedding one end of an electrical connector into the fiber-doped substrate to locate the one end adjacent a surface of the substrate while exposing an opposite end of the electrical connector; and
   locally heating the surface of the fiber-doped substrate to form a continuous electrically conductive trace by the in-situ heat conversion of the electrically insulating fibrous filler including the localized heating at the one end of the pre-embedded electrical connector to electrically connect the electrical connector to the conductive trace.

2. The method of claim 1 further comprising the step of electrodepositing a conductive material on the conductive trace by applying a voltage to the opposite end of the electrical connector.

3. The method of claim 2, wherein the conductive material is copper.

4. The method of claim 2, wherein the conductive material is electrodeposited initially only on the conductive trace.

5. The method of claim 2, wherein the step of electrodepositing the conductive material onto the conductive trace includes the step of filling the conductive material into a channel created by the localized heating during formation of the conductive trace.

6. The method of claim 2, wherein the step of electrodepositing the conductive material on the conductive trace includes the step of adhering the conductive material to the substrate.

7. The method of claim 1, wherein the one end of the electrical connector is located flush with the surface of the substrate.

8. The method of claim 1, wherein the one end of the electrical connector is located below the surface of the substrate.

9. The method of claim 1, wherein the conductive trace and connection between the conductive trace and the one end of the electrical connector are formed by volatilizing the polymer matrix in the substrate and the polymer matrix surrounding the one end of the electrical connector.

10. The method of claim 1 further comprising the step of conducting electrical power through the conductive trace by connecting the opposite end of the electrical connector to an electrical component.

11. The method of claim 1 further comprising the step of conducting electrical power through the electrical connection by connecting the conductive trace to an electrical component.

12. The method of claim 1 further comprising the step of molding of the substrate into the desired shape prior to the localized heating of the substrate.

13. The method of claim 1, wherein a plurality of electrical connectors are embedded into the fiber-doped substrate in a standardized arrangement, each electrical connector being connected to a corresponding conductive trace for electrical connection of the electrical connectors and conductive traces to an electrical component.

14. The method of claim 1 wherein the step of localized heating includes using a laser to form the conductive trace.

15. A method of manufacturing an electrically connectable module from a substrate of an electrically insulating polymer matrix, the method comprising the steps of:
   doping the substrate with an electrically insulating fibrous filler capable of heat conversion to an electrically conductive fibrous filler, to form a fiber-doped substrate;
   embedding one end of an electrical connector into the fiber-doped substrate to locate the one end adjacent a surface of the substrate while exposing an opposite end of the electrical connector;
   locally heating the surface of the fiber-doped substrate to form a continuous electrically conductive trace by the in-situ heat conversion of the electrically insulating fibrous filler including the localized heating at the one end of the pre-embedded electrical connector to electrically connect the electrical connector to the conductive trace; and
   applying a voltage to the opposite end of the electrical connector to apply a voltage to the conductive trace for electrodepositing a conductive material on the conductive trace.

16. The method of claim 15, wherein the conductive material is copper.

17. The method of claim 15, wherein the conductive material is electrodeposited initially only on the conductive trace.

18. The method of claim 15, wherein the step of electrodepositing the conductive material onto the conductive trace includes the step of filling the conductive material into a channel created by the localized heating during formation of the conductive trace.

19. The method of claim 15, wherein the step of electrodepositing the conductive material on the conductive trace includes the step of adhering the conductive material to the substrate.

20. The method of claim 15, wherein the one end of the electrical connector is located flush with the surface of the substrate.

21. The method of claim 15, wherein the one end of the electrical connector is located below the surface of the substrate.

22. The method of claim 15, wherein the conductive trace and connection between the conductive trace and one end of the electrical connector are formed by volatilizing the polymer matrix in the substrate and the polymer matrix surrounding the one end of the electrical connector.

23. The method of claim 15 further comprising the step of conducting electrical power through the conductive trace by connecting the opposite end of the electrical connector to an external electrical component.

24. The method of claim 15 further comprising the step of conducting electrical power through the electrical connection by connecting the conductive trace to an electrical component.

25. The method of claim 15 further comprising the step of molding of the substrate into the desired shape prior to the localized heating of the substrate.

26. The method of claim 15, wherein a plurality of electrical connectors are embedded into the fiber-doped substrate in a standardized arrangement, each electrical connector being connected to a corresponding conductive trace for electrical connection of the electrical connectors and conductive traces to an electrical component.

27. The method of claim 15 wherein the step of localized heating includes using a laser to form the conductive trace.

* * * * *